(12) United States Patent
Makabe et al.

(10) Patent No.: US 8,546,813 B2
(45) Date of Patent: Oct. 1, 2013

(54) SEMICONDUCTOR SUBSTRATE AND SEMICONDUCTOR DEVICE

(75) Inventors: Isao Makabe, Kanagawa (JP); Keiichi Yui, Kanagawa (JP); Ken Nakata, Kanagawa (JP); Takamitsu Kitamura, Kanagawa (JP)

(73) Assignee: Sumitomo Electric Industrires, Ltd., Osaka (JP)

( * ) Notice: Subject to any disclaimer, the term of this patent is extended or adjusted under 35 U.S.C. 154(b) by 156 days.

(21) Appl. No.: 13/172,426

(22) Filed: Jun. 29, 2011

(65) Prior Publication Data
US 2012/0001195 A1 Jan. 5, 2012

(30) Foreign Application Priority Data
Jun. 30, 2010 (JP) ................. 2010-150058

(51) Int. Cl.
*H01L 29/15* (2006.01)

(52) U.S. Cl.
USPC .................. 257/76; 257/98; 257/99

(58) Field of Classification Search
USPC ................................ 257/76, 98, 99
See application file for complete search history.

(56) References Cited

U.S. PATENT DOCUMENTS
2004/0079964 A1* 4/2004 Hori et al. ............ 257/194
2004/0123796 A1* 7/2004 Nagai et al. .......... 117/103
2008/0210949 A1 9/2008 Makabe et al.

FOREIGN PATENT DOCUMENTS
JP 2008-166349 A 7/2008

* cited by examiner

*Primary Examiner* — Tan N Tran
(74) *Attorney, Agent, or Firm* — Westerman, Hattori, Daniels & Adrian, LLP

(57) ABSTRACT

A semiconductor substrate includes an AlN layer that is formed so as to contact a Si substrate and has an FWMH of a rocking curve of a (002) plane by x-ray diffraction, the FWMH being less than or equal to 1500 seconds, and a GaN-based semiconductor layer formed on the AlN layer.

24 Claims, 3 Drawing Sheets

SEMICONDUCTOR SUBSTRATE AND SEMICONDUCTOR DEVICE

CROSS-REFERENCE TO RELATED APPLICATION

This application is based upon and claims the benefit of priority of the prior Japanese Patent Application No. 2010-150058 filed on Jun. 30, 2010, the entire contents of which are incorporated herein by reference.

BACKGROUND (i) Technical Field

A certain aspect of the embodiments discussed herein is related to a semiconductor substrate and a semiconductor device. Another aspect of the embodiments is related to a semiconductor substrate and a semiconductor device in which an aluminum nitride (AlN) layer is formed on a silicon (Si) substrate.

(ii) Related Art

Semiconductor devices using a gallium nitride (GaN) based semiconductor are used as a power device operating at high frequencies and outputting high power, and a light emitting diode or a laser diode emitting light of short wavelengths. Particularly, there has been considerable activity in the development of semiconductor devices suitable for amplification in a high-frequency or RF (radio Frequency) band such as a microwave band, a quasi-millimeter band or a millimeter band. Examples of those semiconductor devices are an FET such as a high electron mobility transistor (HEMT) and light emitting devices such as a laser diode and a light emitting diode.

Generally, a sapphire substrate or a silicon carbide (SiC) substrate is used as a substrate on which the GaN-based semiconductor layer is grown. Since the sapphire substrate and the SiC substrate are expensive, there has been developed an art of growing the GaN-based semiconductor layer on the Si substrate. As Si and Ga react easily, an AlN layer is interposed between the Si substrate and the GaN-based semiconductor layer as a barrier layer (see Japanese Patent Application Publication No. 2008-166349). It is known to form an AlGaN layer between the AlN layer and the GaN layer when the GaN layer is formed on the AlN layer. The use of the AlGaN layer is intended to improve the crystal quality of the GaN layer and reduce a warp of the substrate.

However, there is a case where the warp of the substrate is not reduced even by providing the AlGaN layer on AlN layer.

SUMMARY

According to an aspect of the present invention, there is provided a semiconductor substrate including: an AlN layer that is formed so as to contact a Si substrate and has an FWMH (Full Width at Half Maximum) of a rocking curve of a (002) plane by x-ray diffraction, the FWMH being less than or equal to 1500 seconds; and a GaN-based semiconductor layer formed on the AlN layer.

DETAILED DESCRIPTION (First Embodiment)

Figure 1A:
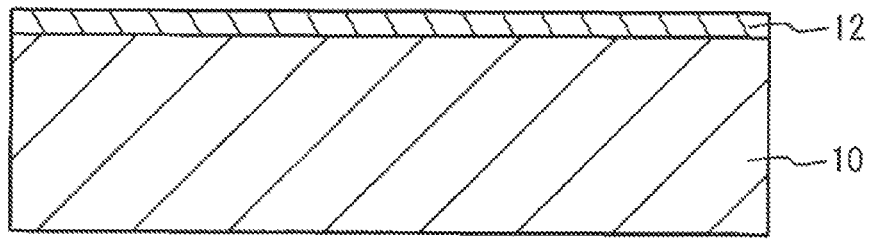
FIGS. 1A through 1C are cross-sectional views that illustrates a method for producing a semiconductor substrate in accordance with a first embodiment.
Figure 1B:
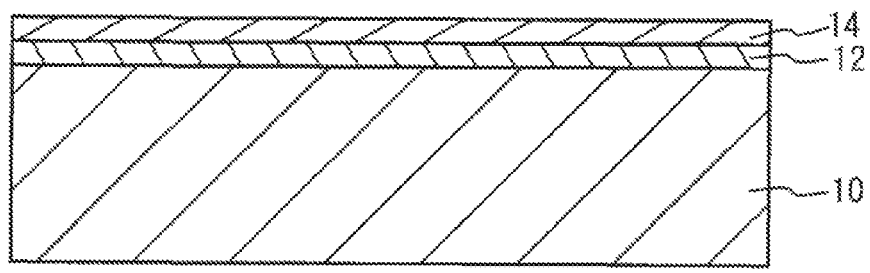
Figure 1C:
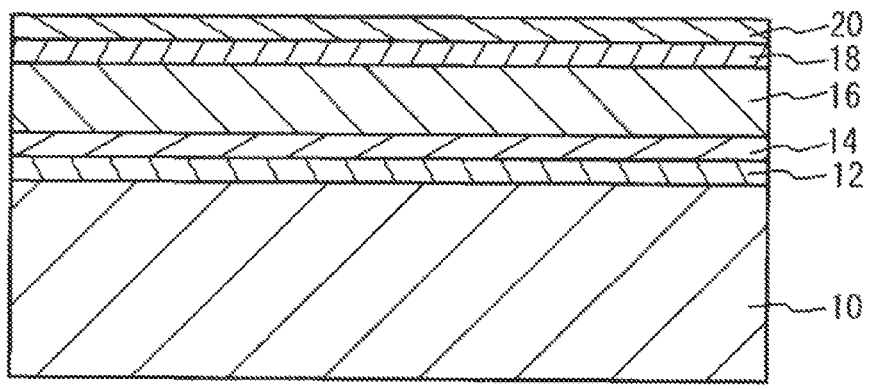

A first embodiment is an exemplary HEMT. FIGS. 1A through 1C are cross-sectional views of a method for fabricating a semiconductor substrate in accordance with the first embodiment. A Si substrate 10 is prepared. The Si substrate 10 may be a 4-inch Si wafer having a thickness of 625 μm. An Al source is supplied to the surface of the Si substrate 10 while a N source is not supplied. This is called a pre-flow of the Al source. As illustrated in FIG. 1A, an AlN layer 12 is formed directly on or in contact with the (111) plane of the Si substrate 10 as a buffer layer by metal organic chemical vapor deposition (MOCVD).

Al pre-flow condition:
  Pre-flow gas; TMA (trimethylaluminium)
  Total quantity of pre-flow: 20 μmol
  Annealing temperature: 1050° C.
  Gas pressure: 100 torr
AlN layer 12 forming condition:
  Source gas: TMA, $NH_3$ (ammonia)
  Growth temperature: 1150° C.
  Gas pressure: 100 torr
  Growth thickness: 300 nm As illustrated in FIG. 1B, the AlGaN layer 14 is formed on the AlN layer 12 by MOCVD as a GaN-based semiconductor layer. The condition for growing the AlGaN layer 14 is as follows.

AlGaN layer 14 forming condition:
  Source gas: $NH_3$, TMA, TMG (trimethylgallium)
  Growth temperature: 1100° C.
  Gas pressure: 100 torr
  Doping: undoped
  Al composition ratio: 0.5
  Growth thickness: 100 nm As illustrated in FIG. 1C, a GaN layer 16 is formed on the AlGaN layer 14 by MOCVD as a channel layer. The GaN layer 16 has a thickness of, for example, 1000 nm. An AlGaN layer 18 is formed on the GaN layer 16 as an electron supply layer. The AlGaN layer 18 has a thickness of, for example, 20 nm and an Al composition ratio of 0.2. A GaN layer 20 is formed on the AlGaN layer 18 as a cap layer. The GaN layer 20 has a thickness of, for example, 2 nm, and is of n type. The growing plane of each layer is the (0001) plane. The HEMT is fabricated by the above process.

Figure 2:
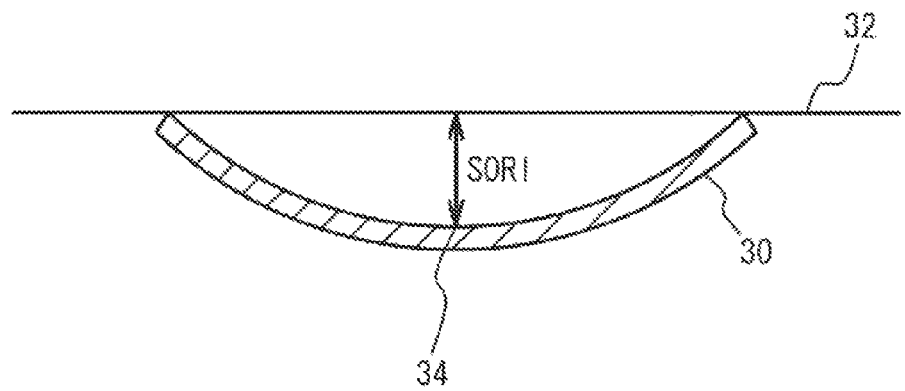
FIG. 2 is a diagram that illustrates a warp of a wafer.

The thickness of the AlN layer 12 may be controlled by controlling the temperature and rate used to grow the AlN layer 12. The inventors changed the growth conditions and measured the FWMH of the rocking curve of the (002) plane of AlN by x-ray diffraction in the state illustrated in FIG. 1A. Wafers on which the Al layer 12 was grown under the same condition were used to produce the semiconductor substrate illustrated in FIG. 1C. Then, warps of the wafers were measured. FIG. 2 is a diagram that illustrates a warp of a wafer 30. As illustrated in FIG. 2, the wafer 30 was placed so that the epitaxial layers face up and both ends of the wafer 30 contact a flat plane 32. A distance between a point 34 at which the wafer is downwards convex at maximum and the flat plane 32 was defined as SORI. In FIG. 2, the magnitude of warp was defined so that a downwards convex has a positive magnitude of warp, and an upwards convex has a negative magnitude of warp.

Figure 3:
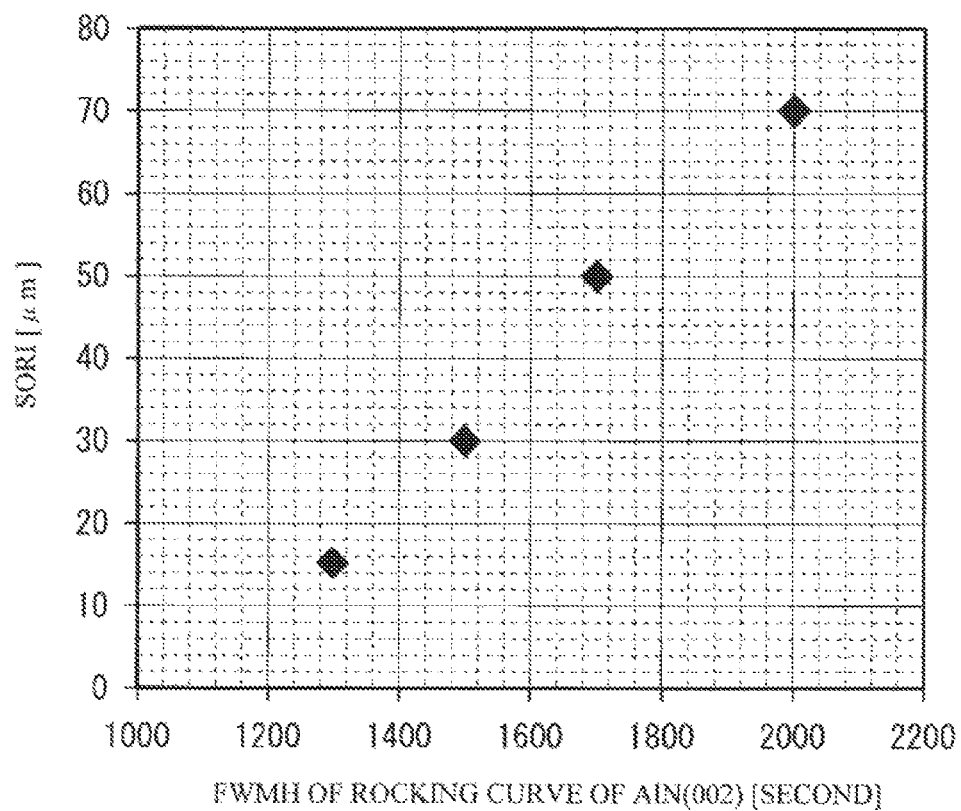
FIG. 3 is a graph of the magnitude of SORI associated with the FWMH of the rocking curve of the AlN (002) plane.

FIG. 3 is a graph of the magnitude of SORI associated with the FWMH of the rocking curve of the AlN (002) plane. As illustrated in FIG. 3, the magnitude of SORI decreases as the FWMH of the rocking curve decreases. The FWMH of the rocking curve represents the crystal quality of the AlN layer 12. For a large FWMH of the rocking curve, the AlN layer 12 has small grains and has a large dispersion of the crystal orientations of the grains. For a small FWMH of the rocking curve, the AlN layer 12 has large grains and has a state closer to single crystal.

As described in the aforementioned patent application, the reason why the AlGaN layer 14 reduces the magnitude of warp is considered as follows. The growth temperature of each layer is about 1000° C., and a warp is caused due to a difference in the linear thermal expansion coefficient. The linear thermal expansion coefficient of the GaN layer 16 is greater than those of Si and AlN. Therefore, if the GaN layer 16 is used alone, the wafer will be warped so as to be downwards convex. That is, the GaN layer 16 generates tensile stress. Particularly, in order to fabricate reliable semiconductor devices, the thickness of the layer including GaN on the AlGaN layer 14 (for example, GaN layer 16) has a thickness of at least 0.8 μm. Thus, the wafer is warped greatly. With the above in mind, the AlGaN layer 14 having the a-axis length greater than that of the AlN layer 12 is provided on the AlN layer 12. Thus, stress so as to cause the wafer to be upwards convex is developed due to the difference in the lattice constant. That is, compressive stress is developed in the AlGaN layer 14 by the AlN layer 12. As described above, it is considered that the magnitude of warp may be reduced by compensating for stress resulting from the GaN layer by stress resulting from the AlGaN layer 14.

However, the inventors considered that if the AlN layer 12 has a poor crystal quality, compressive stress will be not developed and the wafer will be warped greatly. The inventors produced wafers having different FWMHs of the rocking curve of the AlN (002) plane. In a case where the FWMH of the rocking curve of the AlN (002) plane is approximately 3000 seconds, compressive stress is little developed in the AlGaN layer 14. In contrast, in a case where the FWMH of the rocking curve of the AlN (002) plane is not greater than 1500 seconds, sufficient compressive stress is developed in the AlGaN layer 14. The FWMH of the rocking curve is preferably less than or equal to 1300 seconds, and is more preferably less than or equal to 1200 seconds.

For the 4-inch semiconductor substrate, the magnitude of warp of the semiconductor substrate is preferably less than or equal to ±50 μm (the radius of curvature is greater than or equal to ±25 m). In case where the magnitude of warp is over ±50 μm, the semiconductor substrate is no longer used practically in the wafer process of the semiconductor devices. Further, the semiconductor substrate tends to be cracked. It is preferable that the magnitude of warp is not greater than ±40 μm and the radius of curvature is not less than ±20 m. More particularly, the magnitude of warp is not greater than ±30 μm and the radius of curvature is not less than ±15 m.

The GaN-based semiconductor layer formed on the AlN layer 12 is not limited to the AlGaN layer 14 but may be another layer that receives compressive stress from the AlN layer 12. That is, the GaN-based semiconductor layer may be a layer that develops tensile stress in the AlN layer 12. The GaN-based semiconductor layer is a layer including GaN, and may be a GaN layer, an InGaN layer, an AlGaN layer, an InAlGaN layer, or a multilayer including at least two of these layers.

Figure 4:
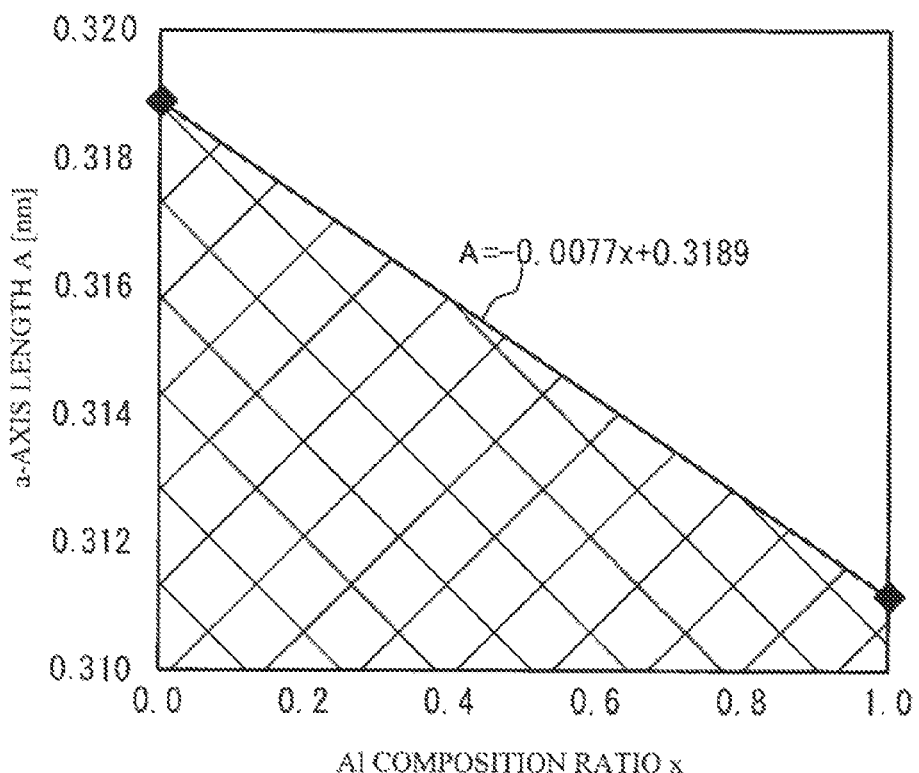
FIG. 4 is a graph that illustrates a relationship between the a-axis length and the Al composition ratio of an AlGaN layer.

FIG. 4 is a graph that relates to a structure in which the GaN layer 16 is provided on the AlGaN layer 14 as the GaN-based semiconductor layer and illustrates a relationship between the a-axis length and the Al composition ratio of the AlGaN layer 14. Referring to FIG. 4, the a-axis length of AlN that does not receive stress is 0.3112 nm, and the a-axis length of GaN that does not receive stress is 0.3189 nm. Thus, the a-axis length of the AlGaN layer that does not receive stress is such that $A = -0.0077x + 0.3189$ nm in FIG. 4. Since the AlGaN layer 14 receives compressive stress, the following relationship stands $$A \geq 0.0077x + 0.3189$$

in a case where the AlGaN layer 14 is an $Al_xGa_{1-x}N$ layer and A (nm) is the a-axis length of the AlGaN layer 14.

In order to cause the AlN layer 12 to have a good crystal quality, it is preferable that the AlN layer 12 is 100 nm thick or more. The AlN layer 12 is preferably 150 nm thick or more. The thickness of the AlN layer 12 is preferably not greater than 400 nm in order to suppress crack or the like. In order to apply compressive stress to the AlN layer 12, the Al composition ratio of the AlGaN layer, that is, x of $Al_xGa_{1-x}N$ is preferably between 0.3 and 0.6, and is more preferably between 0.35 and 0.55.

(Second Embodiment)

Figure 5:
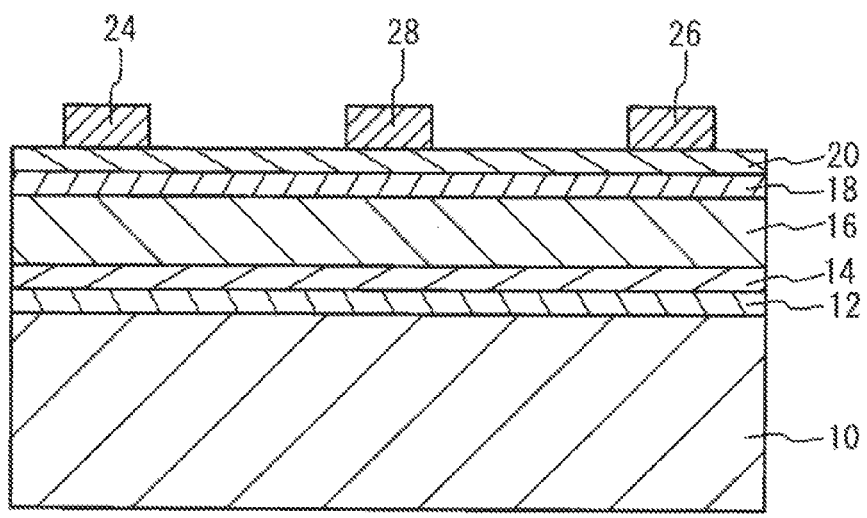
FIG. 5 is a cross-sectional view of a semiconductor device in accordance with a second embodiment.

A second embodiment is an exemplary semiconductor device using the semiconductor substrate produced by the first embodiment. FIG. 5 is a cross-sectional view of a semiconductor device in accordance with the second embodiment. Referring to FIG. 4, a source electrode 24, a drain electrode 26 and a gate electrode 28 are formed on the GaN layer 20 of the semiconductor substrate illustrated in FIG. 1C by a vapor deposition method. The source electrodes 24 and the drain electrodes 26 are ohmic electrodes, each of which is formed by stacking Ti and Au in this order so that Ti is closer to the GaN layer 20. The gate electrode 28 may be formed by stacking Ni and Au in this order so that Ni is closer to the GaN layer 20.

The first and second embodiments may not be limited to HEMT but may be transistors other than HEMT or optical semiconductor devices such as a laser diode and a photodiode.

The present invention is not limited to the specifically described embodiments, but includes other embodiments and variations within the scope of the claimed invention.

What is claimed is:

1. A semiconductor substrate comprising:
   an AlN layer that is formed so as to contact a Si substrate and has a full width at half maximum (FWMH) of a rocking curve of a (002) plane by x-ray diffraction, the FWMH being less than or equal to 1500 seconds; and
   a GaN-based semiconductor layer formed on the AlN layer,
   wherein a radium of curvature of a warp of the semiconductor substrate is not less than ±25 m.

2. The semiconductor substrate according to claim 1, wherein the GaN-based semiconductor layer receives compressive stress from the AlN layer.

3. The semiconductor substrate according to claim 1, wherein the AlN layer has a thickness of 100 nm or more.

4. The semiconductor substrate according to claim 1, wherein the GaN layer is an $Al_xGa_{1-x}N$ layer and an Al composition ratio x is between 0.3 and 0.6.

5. A semiconductor substrate comprising:
an AlN layer that is formed so as to contact a Si substrate and has a full width at half maximum (FWHM) of a rocking curve of a (002) plane by x-ray diffraction, the full width at half maximum (FWHM) being less than or equal to 1500 seconds; and
a GaN-based semiconductor layer formed on the AlN layer,
wherein the semiconductor substrate has a size of 4 inches and a magnitude sori of the semiconductor substrate is not greater than ±50 μm.

6. The semiconductor substrate according to claim 5, wherein the GaN-based semiconductor layer receives compressive stress from the AlN layer.

7. The semiconductor substrate according to claim 3, wherein the AlN layer has a thickness of 100 nm or more.

8. The semiconductor substrate according to claim 5, wherein the GaN layer is an $Al_xGa_{1-x}N$ layer and an Al composition ratio x is between 0.3 and 0.6.

9. A semiconductor substrate comprising:
an AlN layer that is formed so as to contact a Si substrate and has a full width at half maximum (FWHM) of a rocking curve of a (002) plane by x-ray diffraction, the full width at half maximum (FWHM) being less than or equal to 1500 seconds; and
a GaN-based semiconductor layer formed on the AlN layer,
wherein the GaN-based semiconductor layer is configured to include an $Al_xGa_{1-x}N$ layer and a GaN layer formed on the $Al_xGa_{1-x}N$ layer, and an a-axis length A (nm) of the $Al_xGa_{1-x}N$ layer satisfies the following:

$$A < 0.0077x + 0.3189$$

where x is an Al composition ratio.

10. The semiconductor substrate according to claim 9, wherein the GaN-based semiconductor layer receives compressive stress from the AlN layer.

11. The semiconductor substrate according to claim 9, wherein the AlN layer has a thickness of 100 nm or more.

12. The semiconductor substrate according to claim 9, wherein the GaN layer is an $Al_xGa_{1-x}N$ layer and an Al composition ratio x is between 0.3 and 0.6.

13. A semiconductor device comprising:
an AlN layer that is formed so as to contact a Si substrate and has a full width at half maximum FWMH of a rocking curve of a (002) plane by x-ray diffraction, the FWMH being less than or equal to 1500 seconds; and
a GaN-based semiconductor layer formed on the AlN layer,
wherein a radium of curvature of a warp of the semiconductor substrate is not less than ±25 m.

14. The semiconductor device according to claim 13, wherein the GaN-based semiconductor layer receives compressive stress from the AlN layer.

15. The semiconductor device according to claim 13, wherein the AlN layer has a thickness of 100 nm or more.

16. The semiconductor device according to claim 13, wherein the GaN layer is an $Al_xGa_{1-x}N$ layer and an Al composition ratio x is between 0.3 and 0.6.

17. A semiconductor device comprising:
an AlN layer that is formed so as to contact a Si substrate and has a full width at half maximum (FWHM) of a rocking curve of a (002) plane by x-ray diffraction, the full width at half maximum (FWHM) being less than or equal to 1500 seconds; and
a GaN-based semiconductor layer formed on the AlN layer,
wherein a magnitude of sori of the semiconductor substrate is not greater than ±50 μm when the semiconductor substrate has a size of 4 inches.

18. The semiconductor device according to claim 17, wherein the GaN-based semiconductor layer receives compressive stres from the AlN layer.

19. The semiconductor device according to claim 17, wherein the AlN layer has a thickness of 100 nm or more.

20. The semiconductor device according to claim 17, wherein the GaN layer is an $Al_xGa_{1-x}N$ layer and an Al composition ratio x is between 0.3 and 0.6.

21. A semiconductor device comprising:
an AlN layer that is formed so as to contact a Si substrate and has a full width at half maximum (FWHM) of a rocking curve of a (002) plane by x-ray diffraction, the full width at half maximum (FWHM) being less than or equal to 1500 seconds; and
a GaN-based semiconductor layer formed on the AlN layer,
wherein the GaN-based semiconductor layer is configured to include an $Al_xGa_{1-x}N$ layer and a GaN layer formed on the $Al_xGa_{1-x}N$ layer, and an a-axis length A (nm) of the $Al_xGa_{1-x}N$ layer satisfies the following:

$$A < 0.0077x + 0.3189$$

where x is an Al composition ratio.

22. The semiconductor device according to claim 21, wherein the GaN-based semiconductor layer receives compressive stress from the AlN layer.

23. The semiconductor device according to claim 21, wherein the AlN layer has a thickness of 100 nm or more.

24. The semiconductor device according to claim 21, wherein the GaN layer is an $Al_xGa_{1-x}N$ layer and an Al composition ratio x is between 0.3 and 0.6.

* * * * *